(12) United States Patent
Trunk

(10) Patent No.: US 12,210,046 B2
(45) Date of Patent: Jan. 28, 2025

(54) CIRCUIT ASSEMBLY FOR FAULT DETECTION IN AN UNGROUNDED HIGH-VOLTAGE SYSTEM

(71) Applicant: Robert Bosch GmbH, Stuttgart (DE)

(72) Inventor: Martin Trunk, Neuenstadt (DE)

(73) Assignee: Robert Bosch GmbH, Stuttgart (DE)

( * ) Notice: Subject to any disclaimer, the term of this patent is extended or adjusted under 35 U.S.C. 154(b) by 532 days.

(21) Appl. No.: 17/413,854

(22) PCT Filed: Dec. 6, 2019

(86) PCT No.: PCT/EP2019/083952
§ 371 (c)(1),
(2) Date: Jun. 14, 2021

(87) PCT Pub. No.: WO2020/120307
PCT Pub. Date: Jun. 18, 2020

(65) Prior Publication Data
US 2022/0057443 A1    Feb. 24, 2022

(30) Foreign Application Priority Data
Dec. 12, 2018    (DE) ...................... 10 2018 221 479.4

(51) Int. Cl.
*G01R 31/00* (2006.01)
*G01R 31/52* (2020.01)
*H03K 5/24* (2006.01)

(52) U.S. Cl.
CPC .......... *G01R 31/007* (2013.01); *G01R 31/52* (2020.01); *H03K 5/24* (2013.01)

(58) Field of Classification Search
CPC .... G01R 31/007; G01R 31/52; G01R 31/343; G01R 27/025; G01R 27/18; H03K 5/24
See application file for complete search history.

(56) References Cited

U.S. PATENT DOCUMENTS

| 7,557,583 B2 * | 7/2009 | Zettel ................. G01R 31/3278 |
| | | 324/421 |
| 7,560,935 B2 * | 7/2009 | Morimoto ............. B60L 3/0023 |
| | | 324/509 |

(Continued)

FOREIGN PATENT DOCUMENTS

| CN | 2758125 Y * | 2/2006 |
| CN | 103559803 A | 2/2014 |

(Continued)

OTHER PUBLICATIONS

Translation of International Search Report for Application No. PCT/EP2019/083952 dated Feb. 27, 2020 (3 pages).

*Primary Examiner* — Lee E Rodak
*Assistant Examiner* — Demetrius R Pretlow
(74) *Attorney, Agent, or Firm* — Michael Best & Friedrich LLP

(57) ABSTRACT

The invention relates to a circuit assembly (10) for fault detection in an ungrounded high-voltage system (20) having a connected inverter (4) and having at least one resistor (5) between a high-voltage potential (7a, 7b) of the high-voltage system (20) and a reference potential (8), the circuit assembly (10) comprising: a sensing circuit (1), which is designed to tap a voltage from the resistor (5), to generate a first measurement value therefrom and to provide the first measurement value at an output (1c, 1d); and an evaluation device (2), which is connected to the output (1c, 1d) of the sensing circuit (1), the evaluation device (2) being designed to compare the first measurement value with a first limit value and to output a first signal if the first measurement value exceeds the first limit value.

16 Claims, 2 Drawing Sheets

(56) References Cited

U.S. PATENT DOCUMENTS

| | | | | |
|---|---|---|---|---|
| 8,878,542 | B2* | 11/2014 | Bruckhaus | B60L 3/04 |
| | | | | 324/500 |
| 9,244,108 | B2* | 1/2016 | Hausberger | B60L 50/51 |
| 11,841,389 | B2* | 12/2023 | Ock | B60L 3/0069 |
| 2004/0189330 | A1* | 9/2004 | Herb | G01R 27/18 |
| | | | | 324/691 |
| 2005/0068000 | A1* | 3/2005 | Yamada | H02P 27/08 |
| | | | | 318/802 |
| 2008/0084215 | A1* | 4/2008 | Itten | H02H 7/1227 |
| | | | | 324/510 |
| 2009/0179655 | A1* | 7/2009 | Trenchs Magana | G01R 31/52 |
| | | | | 324/537 |
| 2009/0295401 | A1* | 12/2009 | Kamata | G01R 31/52 |
| | | | | 324/509 |
| 2010/0117582 | A1* | 5/2010 | Ogawa | H02H 1/0038 |
| | | | | 318/490 |
| 2012/0014020 | A1* | 1/2012 | Lehmann | H02S 50/00 |
| | | | | 324/509 |
| 2012/0098470 | A1* | 4/2012 | Itou | H02P 29/0241 |
| | | | | 307/9.1 |
| 2013/0257446 | A1* | 10/2013 | Soell | B60L 50/72 |
| | | | | 324/503 |
| 2014/0049860 | A1* | 2/2014 | Arima | G01R 31/52 |
| | | | | 361/42 |
| 2016/0258993 | A1* | 9/2016 | Bagchi | G01R 31/52 |
| 2017/0201170 | A1* | 7/2017 | Abu-Hajar | H02M 7/48 |
| 2018/0267094 | A1* | 9/2018 | Moertl | G01R 31/1272 |
| 2019/0100104 | A1* | 4/2019 | Kawamura | G01R 31/14 |
| 2020/0021184 | A1* | 1/2020 | Frampton | H02H 9/042 |
| 2020/0088803 | A1* | 3/2020 | Park | G01R 27/025 |
| 2020/0110125 | A1* | 4/2020 | Lehnhardt | G01R 31/1245 |
| 2020/0127469 | A1* | 4/2020 | Haindl | B60L 3/0007 |
| 2021/0293865 | A1* | 9/2021 | Kouda | G01R 27/18 |

FOREIGN PATENT DOCUMENTS

| | | | | |
|---|---|---|---|---|
| CN | 107110899 A | | 8/2017 | |
| DE | 102010006108 A1 | | 8/2011 | |
| DE | 102010030079 A1 | | 12/2011 | |
| DE | 102010030083 A1 | | 12/2011 | |
| DE | 102010030129 A1 | * | 12/2011 | ............ G01R 27/18 |
| DE | 102011012588 B4 | * | 10/2015 | ............ G01R 31/02 |
| DE | 102016006643 A1 | | 2/2017 | |
| DE | 102016005732 A1 | | 11/2017 | |
| EP | 2570289 A1 | | 3/2013 | |
| EP | 3375655 A1 | | 9/2018 | |
| JP | 2010043916 A | | 2/2010 | |

* cited by examiner under certain circumstances, can be destroyed, which is associated with a safety risk. It is therefore advantageous if detection of an insulation fault of this type, which generates such recharging currents, is executed at the earliest opportunity.

CIRCUIT ASSEMBLY FOR FAULT DETECTION IN AN UNGROUNDED HIGH-VOLTAGE SYSTEM

BACKGROUND OF THE INVENTION

The invention relates to a circuit assembly for fault detection in an ungrounded high-voltage system having an inverter, which can actuate a single-phase or multi-phase load via a phase cable.

In the technical field of high-voltage electrical systems, the operational safety must be reliably ensured at all times. To this end, high-voltage systems of this type are configured in the form of IT systems (IT="Isolé Terre" or "isolated ground"), in which all live parts are either isolated from the HV ground potential GND or are connected to the HV ground potential GND via sufficiently high impedances.

For the drive in hybrid or electric vehicles, electrical machines in the form of rotating field machines are generally employed, which are operated in conjunction with a.c. converters—frequently also described as inverters—and are supplied by an electric battery, a fuel cell or a combination thereof.

Since, in an IT system of this type, an initial insulation fault can optionally be tolerated on the grounds that, in the event of the initial insulation fault, a closed electrical circuit is not established, a superior fail-safe response is associated with a system of this type. However, it must be ensured that an insulation fault of this type is detected and reported. To this end, it is necessary for the entire electrical system to be monitored, at least periodically, even during the operation of the vehicle.

As a result of insulation faults, additional voltages and currents can occur on circuit components which are not configured therefor and cannot withstand associated loading on a long-term basis. The Y-capacitors are one example, which, in accordance with the requirements for EMC (electromagnetic compatibility), are connected between the high-voltage potentials and a reference potential such as the vehicle ground. An insulation fault can generate high recharging currents, resulting in the destruction of the component.

For the detection of insulation faults, so-called insulation monitors can be employed, which track variations in the insulation resistance by way of small superimposed voltages between a high-voltage potential and a reference potential. For the purposes of fault detection in the insulation of a phase cable which connects an inverter to a load, this fault detection is handicapped by a switching signal of the inverter which is superimposed on the high-voltage potential.

A method and an apparatus are known from DE 10 2010 030 079 A1 for the monitoring of the insulation resistance in an ungrounded electrical system having an intermediate DC voltage circuit and at least one inverter which is connected thereto, for the control of an n-phase electrical load in an n-phase system. A voltage to be monitored is herein determined during the operation of the load, which voltage represents a voltage deviation in supply voltage potentials of the intermediate DC voltage circuit with respect to a reference potential. Moreover, a variable which is characteristic of an electrical frequency of the electrical load is determined, particularly an electrical angular velocity of the electrical load. A first spectral amplitude of the voltage to be monitored at the n-fold electrical frequency of the electrical load is compared with a first reference value, and a symmetrical insulation fault in the intermediate DC voltage circuit or in the n-phase system is detected if the comparison reveals a deviation in the first spectral amplitude from the first reference value.

SUMMARY OF THE INVENTION

The object of the present invention is therefore to specify a simple circuit assembly which executes the load-specific in-service monitoring of the high-voltage system having a connected inverter for faults, particularly insulation faults in the inverter, the phase cable and units which are connected thereto and, where applicable, signals that a fault is present, thereby additionally preventing overloads and associated consequential faults e.g. in Y-capacitors.

According to the invention, a circuit assembly for fault detection, a system for fault detection, a method for fault detection, and also a computer program product and a computer-readable storage medium are disclosed, which at least partially have the above-mentioned functions.

The invention is based on the knowledge that an insulation fault, e.g. on a phase cable, generates a voltage drop on symmetric resistors, which can be characteristic of the loading of Y-capacitors by recharging currents.

The circuit assembly according to the invention is provided for fault detection in an ungrounded high-voltage system having a connected inverter, wherein the high-voltage system comprises at least one resistor between a high-voltage potential of the high-voltage system and a reference potential. A detection circuit of the circuit assembly taps a voltage from the resistor, and generates a first measurement variable therefrom. This measurement variable is delivered at the output of the detection circuit. A measurement variable of this type is deduced from the tapped voltage, in order to prepare a comparison in an evaluation device. The resistor can be arranged between one of the two high-voltage potentials for the symmetrization of the high-voltage potentials, and can be a so-called symmetric resistor in a series of a plurality of symmetric resistors for voltage symmetrization between in each case one of the high-voltage potentials and a reference potential. A reference potential of this type can be formed e.g. by a housing contact, wherein, for example, the housing encloses elements of the high-voltage system. A measurement variable of this type can be formed for example by a temporal integration of a rectified voltage which drops across the resistor. The circuit assembly further comprises an evaluation device, which is connected to an output of the detection circuit. This evaluation device is designed both to compare the first measurement variable with a first limiting value and to output a first signal if the first measurement variable exceeds the first limiting value. The high-voltage potential is herein defined as an electrical potential of the high-voltage system, which results from the electrical contact with the positive high-voltage terminal HV+ or a negative high-voltage terminal HV− of the high-voltage system and correspondingly defines a positive or negative high-voltage potential.

In the event of an insulation fault e.g. on the phase cable, the pulse action of the inverter which, for each phase of the load, connects the positive high-voltage potential and the negative high-voltage potential to the load in an alternating manner, generates a high recharging current in the EMC-Y-capacitors, which are connected between a high-voltage potential and a reference potential, such as the housing ground.

In the event of a fault of this type, the Y-capacitors, which are not customarily rated for this type of fault, depending on the high-voltage recharging voltage on the Y-capacitors and the pulse-width modulation frequency, can undergo thermal overloading.

A corresponding voltage variation is associated with an insulation fault of this type with respect to the magnitude and/or the temporal characteristic on the symmetric resistors, as the symmetric resistors are connected in parallel with the Y-capacitors.

The symmetric resistors are typically composed of a plurality of individual resistors such that, when the voltage is tapped from an individual resistor in this plurality of symmetric resistors, a reduction in the voltage which is favorable for the detection circuit can be generated. From this voltage, the detection circuit generates a first measurement variable, which is then compared in the evaluation device with a first limiting value, which is saved in the evaluation device. This first limiting value, by the replacement of the saved value, can thus be adapted to different operating scenarios. According to the invention, a resistor of this type can also be arranged between a high-voltage potential of the high-voltage system and a reference potential additionally to symmetric resistors or alternatively to symmetric resistors.

This voltage on the resistor varies in accordance with the pulse of the inverter phases and, on the basis of an insulation fault, on e.g. one phase of the phase cable, can both increase in magnitude and have a different temporal characteristic. In both cases, the first measurement variable of the detection circuit results in a higher value, and the comparison with a first limiting value results in an overshoot, when the first limiting value is selected in accordance with the scenarios to be verified. On the basis of the overshoot of the first limiting value, the evaluation device outputs a first signal.

By means of this circuit assembly, it is thus achieved that a reliable and simple detection of an insulation fault, which would otherwise be difficult to detect in-service, is ensured. The circuit assembly moreover achieves an early detection of potential overload states in peripheral components or units.

According to one configuration of the invention, it is proposed that the circuit assembly is employed for a high-voltage system, in which the connected inverter is controlled by a control device. In this configuration, the evaluation unit is designed to output a trigger signal for the control device (3).

According to one configuration of the invention, it is proposed that the evaluation device is designed to output the first signal as a trigger signal for the control device of the inverter.

The inverter can be configured such that, on the reception of the trigger signal from the evaluation device, it switches to a special operating mode for a predefined time interval. Optionally, isolated operation, a bottom-end short-circuit, a top-end short-circuit of the inverter, or another form of special operating mode, depending on the type of machine and the safety concept, can be provided in the form of a special operating mode of this type. Accordingly, depending on the duration of the special operating mode, a reduction in the loading of the peripheral components or units can already be achieved. However, the duration of the special operating mode can also be adapted to scenarios to be detected and the sensitivity of the evaluation device.

According to one measure which improves the invention, it is proposed that the evaluation device is designed, subsequently to the output of the trigger signal for the control device, to compare a second measurement variable, which is generated by the detection circuit further to the tap-off of a further voltage, with a second limiting value and, in the event of the undershoot of the second limiting value, to output a second signal.

It can thus be achieved that, during the special operating mode of the inverter, a second measurement variable, which is generated by the detection device, is compared with the second limiting value. If the second measurement variable now undershoots the second limiting value, the evaluation device outputs a second signal.

The first limiting value can be selected such that it is of equal magnitude to the second limiting value.

If a second signal of this type is output by the evaluation device when the latter, on the basis of the overshoot of the first limiting value, has previously triggered the inverter to switch to the special operating mode, this signifies that the insulation fault is present in the unit composed of the inverter and the phase cable to the unit, or in the unit itself, as it only occurs during the routine operation of the inverter. An insulation fault is thus detected thereby in a simple manner, and the cause has at least been attributed to a subregion of the high-voltage system.

According to one configuration of the invention, it is proposed that the detection circuit is designed to generate the first and second measurement variables in the form of a characteristic variable for loading of a component. This means that the first measurement variable is generated from the voltage signal characteristic in a manner such that the magnitude of the measurement variable is characteristic of the loading of a component in the high-voltage system. A component of this type can be e.g. a Y-capacitor.

The circuit assembly can cooperate with the correspondingly designed control device of the inverter such that, on the reception of the second signal, the operation of the inverter is permanently interrupted.

According to one exemplary embodiment of the invention, the evaluation device can comprise a digital signal processing unit. The evaluation device can comprise, for example, a microprocessor. Accordingly, other complex evaluation processes, which are inferred from the fundamental concept and the teaching of this invention, can also be easily implemented. By means of an AD conversion channel, the first or second measurement variable, which can indicate the degree of loading of the Y-capacitor, can be input and made available as a value to corresponding software functions.

According to one configuration of the invention, it is proposed that the control function between the evaluation device and the control device, together with the control function of the evaluation device itself, are executed by a separate e.g. central control device.

The invention moreover comprises a system for fault detection in an ungrounded high-voltage system having a positive and a negative high-voltage potential, wherein the high-voltage system is connected to an inverter. The system has at least one series-connected arrangement of resistors between one of the high-voltage potentials of the high-voltage system and a reference potential, and at least one capacitance is arranged between one of the high-voltage potentials of the high-voltage system and the reference potential.

The system moreover comprises a circuit assembly having a detection circuit and an evaluation device. The detection circuit taps a voltage from the resistor and generates a first measurement variable from the latter. This measurement variable is delivered at the output of the detection circuit. A measurement variable of this type is derived from the tapped voltage, in order to prepare a comparison in an evaluation device. The resistor can be arranged between one of the two high-voltage potentials for the symmetrization of the high-voltage potentials, and can be a so-called symmetric resistor in a series of a plurality of resistors for voltage symmetrization between in each case one of the high-voltage potentials and a reference potential.

A reference potential of this type can be formed by a housing contact, wherein the housing, for example, encloses elements of the high-voltage system. A measurement variable of this type, for example, can be formed by a temporal integration of the voltage on the resistor.

The system moreover comprises an evaluation device, which is connected to an output of the detection circuit. This evaluation device is designed both to compare the first measurement variable with a first limiting value and to output a first signal if the first measurement variable exceeds the first limiting value. The high-voltage potential is herein defined as an electrical potential of the high-voltage system, which results from the electrical contact with the positive high-voltage terminal HV+ or a negative high-voltage terminal HV− of the high-voltage system and correspondingly defines a positive or negative high-voltage potential.

The system further comprises a control device for controlling the inverter, and the evaluation device of the circuit assembly is designed to output trigger signals for the control device.

In one configuration of the invention, it is proposed that the control device of the system is designed, on the basis of a trigger signal from the evaluation device, to deliver an actuation signal to the inverter which is connected to the control device, in order to operate the inverter in a special operating mode.

Optionally, isolated operation, a bottom-end short-circuit of the inverter, a top-end short-circuit of the inverter or another form of special operating mode of the inverter, depending on the type of machine and the safety concept, can be provided as a special operating mode of this type. Accordingly, depending on the duration of the special operating mode, a reduction in the loading of the peripheral components or units can already be achieved. However, the duration of the special operating mode can also be adapted to the scenarios to be detected and the sensitivity of the evaluation device.

In a further configuration of the invention, it is proposed that the system comprises at least one capacitance, which is connected in parallel with the symmetric resistor. Y-capacitances of this type are regularly installed for the purposes of compliance with EMC regulations and, for the application of this circuit assembly according to the invention, can be configured with a more cost-effective rating, as any overloading of said capacitances is detected rapidly.

According to further configurations of the invention, the system can also comprise further features of the above-described circuit assembly individually or in combination.

According to a further configuration of the invention, it is proposed that the detection circuit of the circuit assembly or of the system comprises a series-connected arrangement of a coupling capacitor, a diode, a limiting resistor and a charging capacitor, and this series-connected arrangement is electrically connected to the first and second contact of the resistor. Additionally, a discharge resistor is connected in parallel with the charging capacitance, wherein the two terminals of the discharge resistor form the output of the detection circuit. A detection circuit of this type, which is composed from only a limited number of components, is particularly cost-effective and simple to implement.

By means of the coupling capacitor, a high pass is formed in the detection circuit, such that higher frequencies generate a higher charging current. On the basis of the peak value rectification by the diode, the maximum voltage variation in the charging capacitor is saved. The discharge resistor discharges the charging capacitor when the voltage further drops on the symmetric resistor. The limiting resistor serves for the limitation of the charging current on the charging capacitor and can optionally be omitted. The voltage of the Y-capacitor, which voltage is subdivided by the symmetric resistor string, is thus fed to a peak value rectifier with a low-pass response. A detection circuit of this type thus generates a measurement variable at its output, which measurement variable is characteristic of the loading e.g. of a Y-capacitor, and can be executed in the form of circuitry by way of a plurality of circuit variants.

The invention moreover discloses a method for fault detection in an ungrounded high-voltage system having a connected inverter, wherein the high-voltage system comprises at least one resistor between a high-voltage potential and a reference potential. A detection circuit herein taps a voltage from the resistor and generates a first measurement variable therefrom, and, by means of an evaluation device, a comparison is executed as to whether the first measurement variable exceeds a first limiting value. In the event of an overshoot of the first limiting value by the first measurement variable, a first signal is output by the evaluation unit.

According to a further configuration of the invention, it is proposed that the first signal is output from the evaluation device to a control device, to which the inverter is connected, and the control device, on the basis of the reception of the first signal, switches the inverter to a special operating mode. This special operating mode can at least be maintained for a predefined time interval. Depending on the application of the method and the operating state of the entire system, this time interval can also be extended, e.g. by the evaluation unit, in order to ensure a reliable detection of insulation faults. It is possible that a particularly short time interval may not be sufficient to detect a second measurement variable, which is characteristic of the altered state.

In one configuration of the method according to the invention, it is proposed that, subsequent to the output of the first signal, a further voltage is tapped from the resistor by means of the detection circuit, a second measurement variable is generated, and, by means of the evaluation circuit, a comparison is executed as to whether the second measurement variable is smaller than a second limiting value, and a second signal is output if the second measurement variable undershoots the second limiting value.

This then means that the cause of an increased voltage integral on the resistor can be attributed to an insulation fault on the inverter, on the phase cable which is connected thereto, or on the unit.

The invention moreover discloses a computer program product comprising commands which, on the running of the program by a computer, instruct the latter to execute the above-described method.

The invention moreover discloses a computer-readable storage medium comprising commands which, on the running of the program by a computer, instruct the latter to execute the above-described method.

BRIEF DESCRIPTION OF THE DRAWINGS

Exemplary embodiments of the invention are represented in FIGS. 1 and 2, and described in greater detail hereinafter. In the figures.

DETAILED DESCRIPTION

Figure 1:
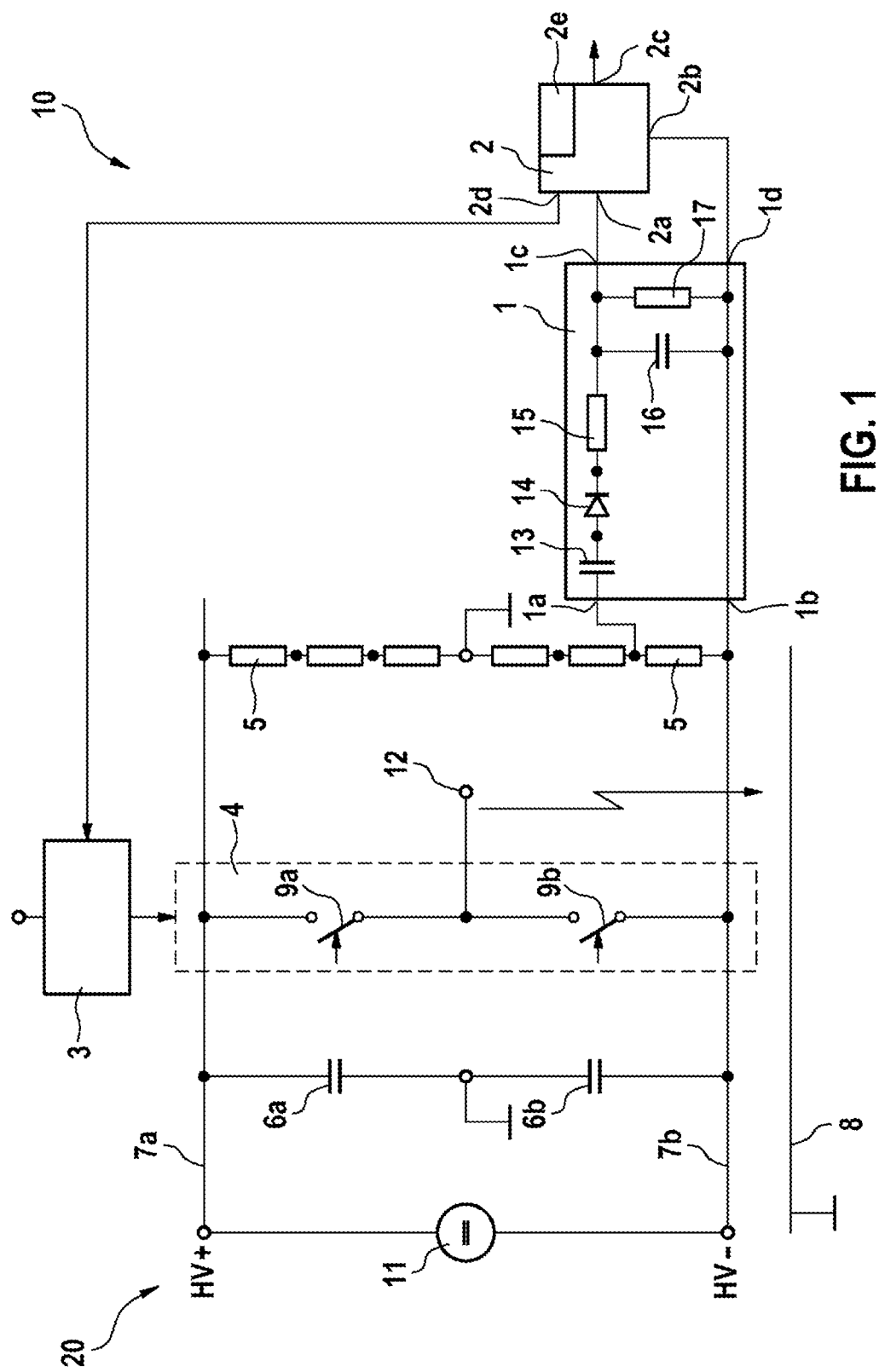
FIG. 1 shows a block circuit diagram of a circuit assembly for fault detection, incorporated in an ungrounded high-voltage system having a connected inverter.

FIG. 1 shows an exemplary block circuit diagram of a circuit assembly 10 for fault detection in an ungrounded high-voltage system 20 having an integrated inverter 4, wherein the actual energy source 11 of the high-voltage system 20 in this exemplary embodiment is configured as a rechargeable battery e.g. of an electric vehicle. Alternatively, a fuel cell can be coupled to the rechargeable DC voltage source via a DC/DC converter, or a fuel cell can be provided in place of the HV battery.

The high-voltage system 20 comprises a positive high-voltage potential 7a and a negative high-voltage potential 7b and is configured in the form of an IT system, such that the live components are connected in an isolated manner from the ground potential GND of earth. These high-voltage potentials are connected to a positive high-voltage terminal HV+ and a negative high-voltage terminal HV− of the high-voltage system in an electrically conductive manner. In parallel with these high-voltage potentials 7a, 7b of the high-voltage system 20, at least one inverter 4 is connected which, in FIG. 1, is represented as a single-phase inverter 4 only but which, by way of duplication, can also be configured in the form of a multi-pole inverter system.

A load can be coupled to the inverter 4 via the terminal 12, which is connected between the switching elements 9a and 9b of the inverter 4, which are connected in series between the high-voltage potentials.

At least one Y-capacitor 6a and 6b and at least one symmetric resistor 5 respectively connect a high-voltage potential 7a or 7b to a reference potential 8 such as, e.g. a housing ground. The symmetric resistors 5, which are illustrated as a series-connected arrangement of resistors and are connected in series between the two high-voltage potentials 7a or 7b, by means of an electrical connection of their node point to the ground potential, execute a symmetrization of the potentials with respect to the ground potential. Typical ratings for the symmetric resistors 5 are within the range of 0.5 Mohm to 5 Mohm.

A control device 3 of the inverter 4 controls the switching elements 9a and 9b of the inverter 4 in accordance with the operating conditions of a load, which can be connected to the inverter 4 via the terminal 12. In FIG. 1, a zig-zag arrow between the phase terminal 12 and the reference potential 8 indicates those components of a high-voltage system between which an insulation fault might be present for example.

Via its input terminals 1a and 1b, a detection circuit 1 taps a voltage from at least one of the resistors 5 of the series-connected symmetric resistors 5, and generates a first measurement variable therefrom, which is delivered by the detection circuit 1 at its output terminals 1c and 1d.

The evaluation device 2 is connected by its input contacts 2a and 2b to the output terminals 1c and 1d of the detection circuit. The evaluation device 2 receives the first measurement variable which is delivered by the detection unit 1 and compares said measurement variable with a saved first limiting value 2e. If this comparison reveals an overshoot of the first limiting value 2e by the first measurement variable, the evaluation device 2 outputs a first signal at its output 2c.

Via the terminal 2d, the evaluation device 2 can output a trigger signal to the control device 3 of the inverter 4, if an overshoot of the first limiting value 2e by the first measurement variable is revealed by the comparison of the first measurement variable of the detection circuit with the saved first limiting value 2e.

The control device 3 of the inverter 4 can be configured, on the basis of the first signal from the evaluation device 2, to switch the control unit 4 to a special operating mode for a predefined time interval. The special operating mode signifies here that the switching elements 9a and 9b or, in multi-phase operation, even the further switching elements of the other phases, switch to an open-circuit position. Optionally, depending on the type of machine and the safety concept, in the special operating mode, the inverter can also be connected with a bottom-end or top-end short-circuit or another form of special operating mode.

This open-circuiting of the switching elements 9a and 9b e.g. in the special operating mode suppresses the contact of the output of the inverter with the reference potential, which contact is caused by an insulation fault, whereupon the detection circuit 1 measures a lower voltage on the symmetric resistor 5 and correspondingly delivers a smaller second measurement variable at the output 1c and 1d. This second measurement variable is then compared by the evaluation device 2 with the second limiting value and is identified as undershooting the second limiting value, provided that the insulation fault was caused by the inverter 4 itself, by a connection line to the load or by the load.

The evaluation device 2 is designed such that, in this case, it can output a second signal, either for the notification of a corresponding identified fault, or the control device 3 of the inverter 4 can be configured such that, by means of this second signal, the inverter 4 is permanently disconnected, to achieve safe operation of the high-voltage system 20. Alternatively, however, the second signal can also be fed to a superordinate control unit which, depending on the operating state of the overall system, such as e.g. of a vehicle in which the high-voltage system is integrated, decides whether the inverter is to be disconnected on the basis of the fault identified. Optionally, a warning can also be generated in the first instance, and the overall system can be run down in a "soft" manner thereafter, i.e. without potentially damaging impact on the battery or the fuel cell.

As an exemplary embodiment, the detection circuit 1 in FIG. 1 is configured in the form of a series-connected arrangement composed of a first input terminal 1a, a coupling capacitor 13, a diode 14, a limiting resistor 15, a charging capacitor 16 and a second input terminal 1b. The output terminals 1c of the detection device 2 are electrically connected in parallel with the charging capacitor 16, to which a discharge resistor 18 is electrically connected in parallel. Accordingly, the voltage of the Y-capacitor 6a, 6b, which voltage is subdivided by the symmetric resistor string 5, is fed to a peak value rectifier with a low-pass response. The measurement variable of the detection circuit 1 is then delivered on the charging capacitor 16.

Figure 2:
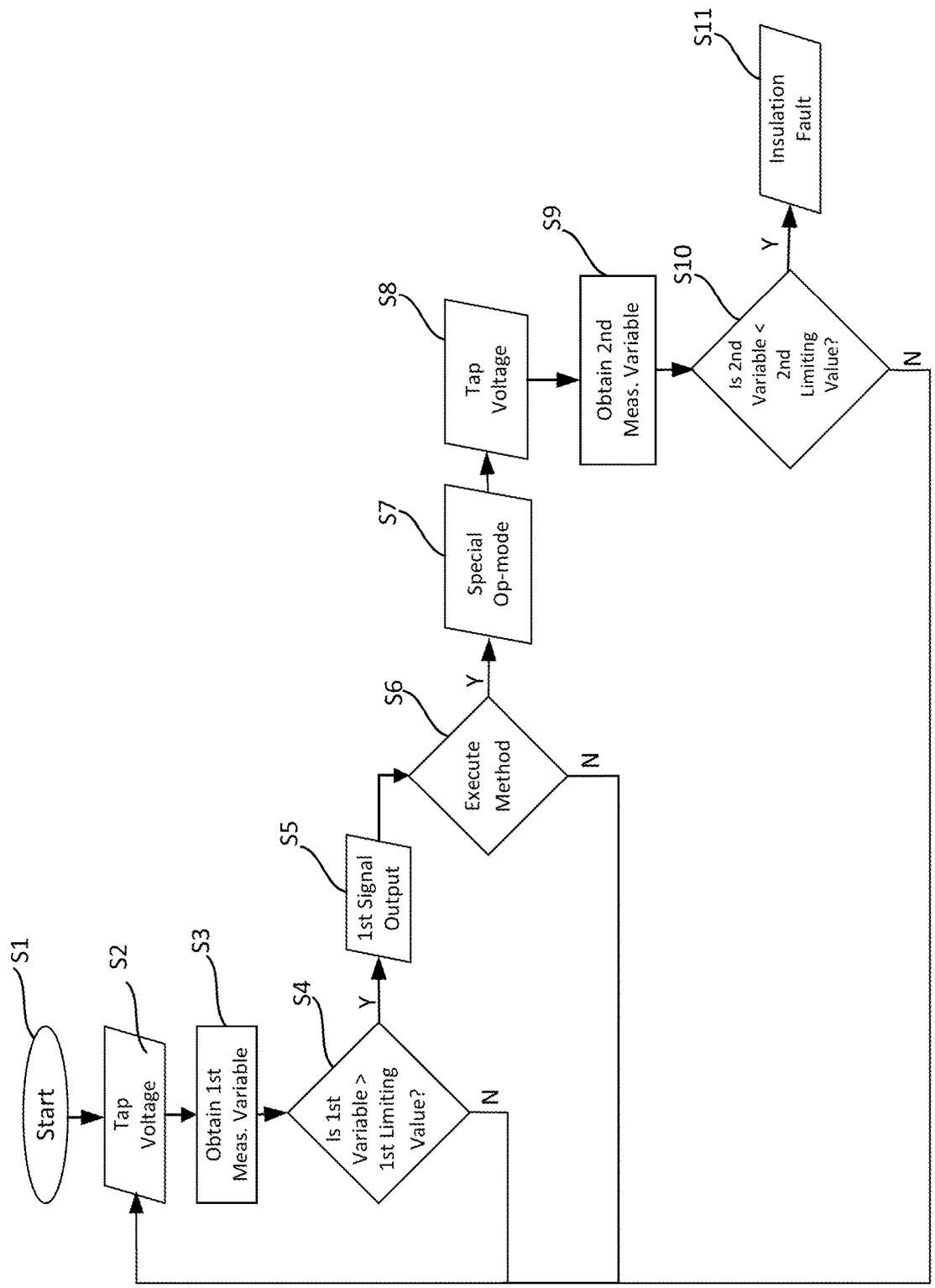
FIG. 2 shows a flow diagram of a method for fault detection in an ungrounded high-voltage system having a connected inverter.

FIG. 2 serves to explain the method for fault detection in an ungrounded high-voltage system 20 having a connected inverter 4, wherein the high-voltage system 20 comprises at least one symmetric resistor 5 between a high-voltage potential 7a, 7b and a reference potential 8. Following the start S1 of the method, by means of a detection circuit 1, a voltage is tapped S2 from the symmetric resistor 5, and a first measurement variable is generated S3. By means of an evaluation device 2, a comparison S4 is then executed as to whether the first measurement variable overshoots a first limiting value 2e, and, in the event of an overshoot of the first limiting value 2e, a first signal is output S5. If the first limiting value is not overshot, a voltage is further tapped S2. The signal thus represents a warning or an alarm signal only.

According to a further exemplary embodiment, by means of a superordinate control circuit or at the start of operation, a setting can be defined as to whether a further part of the method is to be executed S6. If the further part of the method, subsequent to the output of a first signal S5, is not to be executed, a voltage is further tapped again S2. If the further part of the method is to be executed, the first signal is output S7 to the control device 3 by the evaluation unit 2, whereupon the control device 3 switches the inverter 4 to a special operating mode for a predefined time interval. During the special operating mode of the inverter 4, a further voltage is tapped S8 from the symmetric resistor 5, and a second measurement variable is generated S9. In the next step, a comparison S10 is executed as to whether the second measurement variable is smaller than the second limiting value. If the second measurement variable is smaller than the second limiting value, it proceeds that an insulation fault is present in the supply branch circuit of the load, which is connected to the inverter 4 via the terminal 12 and a cable, or is present in the inverter 4 itself.

The invention claimed is:

1. A circuit assembly (10) for fault detection in an ungrounded high-voltage system (20) having a connected inverter (4), a series-connected arrangement of resistors (5) disposed between a positive high-voltage potential (7a) of the high-voltage system (20) and a negative high-voltage potential (7b), and a y-capacitor (6a) connected in parallel to the resistors (5), wherein at least one of the resistors is directly connected to a reference potential (8), wherein the circuit assembly (10) comprises:
   a detection circuit (1), which is configured to tap a voltage from another of the resistors (5) to generate a first measurement variable therefrom, the first measurement variable characterizing a load of the y-capacitor (6a), and
   to deliver the first measurement variable to an output (1c, 1d), and
   an evaluation device (2), which is connected to the output (1c, 1d) of the detection circuit (1), wherein the evaluation device (2) is configured:
      to compare the first measurement variable with a first limiting value, and
      to output a first signal if the first measurement variable overshoots the first limiting value.

2. The circuit assembly (10) as claimed in claim 1, wherein the inverter (4) which is connected to the high-voltage system is controlled by a control device (3), wherein the evaluation unit (2) is configured to output a trigger signal for the control device (3).

3. The circuit assembly (10) as claimed in claim 2, wherein the evaluation device (2) is configured to output the first signal as a trigger signal for the control device (3) of the inverter (4).

4. The circuit assembly (10) as claimed in claim 2, wherein the evaluation device (2) is configured, subsequent to the output of the trigger signal for the control device (3), to compare a second measurement variable, which is generated by the detection circuit further to a tap-off of a further voltage, with a second limiting value and, in the event of the undershoot of the second limiting value, to output a second signal.

5. The circuit assembly (10) as claimed in claim 1, wherein the detection circuit (1) is configured to generate the first or second measurement variable in the form of a characteristic variable for loading of a component.

6. The circuit assembly (10) as claimed in claim 1, wherein the detection circuit (1) comprises a series-connected arrangement of a coupling capacitor (13), a diode (14), a limiting resistor (15) and a charging capacitor (16), wherein the detection circuit (1) is electrically connected to a first and second contact of the another resistor (5), and a discharge resistor (17) is electrically connected in parallel with the charging capacitor (16), wherein the two terminals of the discharge resistor (17) form the output (1c, 1d) of the detection circuit (1).

7. A system for fault detection in an ungrounded high-voltage system (20) having a connected inverter (4) and a positive and negative high-voltage potential (7a, 7b), wherein the system comprises:
   at least one capacitance (6a, 6b) between one of the high-voltage potentials (7a, 7b) of the high-voltage system (20) and the reference potential (8),
   a circuit assembly (10) as claimed in claim 1, and
   a control device (3), which controls the inverter (4),
   wherein the evaluation device (2) of the circuit assembly (10) is configured to output a trigger signal for the control device (3).

8. A method for fault detection in an ungrounded high-voltage system (20) having a connected inverter (4) and having at least one resistor (5) between a high-voltage potential (7a, 7b) of the high-voltage system (20), a reference potential (8), and a y-capacitor (6a) connected in parallel to the resistors (5),the method comprising:
   tapping, via a detection circuit (1), a voltage from the resistor (5) (S2),
   generating (S3) a first measurement variable, the first measurement variable characterizing a load of the y-capacitor (6a),
   determining (S4), via an evaluation device (2), whether the first measurement variable overshoots a first limiting value,
   in the event of an overshoot of the first limiting value, outputting a first signal (S5) via the evaluation device (2),
   tapping via the detection circuit (1), a further voltage from the resistor (5),
   generating a second measurement variable, and
   determining, via the evaluation device (2), whether the second measurement variable is smaller than a second limiting value.

9. The method for fault detection as claimed in claim 8, wherein the inverter (4) is connected to a control device (3), and wherein the first signal is output from the evaluation device (2) for the control device (3) (S7), and the control device (3), on the basis of the reception of the first signal, switches the inverter (4) to a special operating mode.

10. The method for fault detection as claimed in claim 8, including outputting a second signal when the second measurement variable undershoots the second limiting value.

11. A non-transitory, computer-readable medium comprising commands which, when executed by a computer, cause the computer to
   tap, via a detection circuit (1), a voltage from a resistor (5) in an ungrounded high-voltage system (20) having a connected inverter (4), a series-connected arrangement of resistors (5) including the resistor (5) disposed between a positive high-voltage potential (7a) of the high-voltage system (20) and a negative high-voltage potential (7b), and a y-capacitor (6a) connected in parallel to the resistors (5) (S2), wherein at least one of the resistors is directly connected to a reference potential (8), generate (S3) a first measurement variable, the first measurement variable characterizing a load of the y-capacitor (6a), determine (S4) whether the first measurement variable overshoots a first limiting value, in the event of an overshoot of the first limiting value, output a first signal (S5) via the evaluation circuit (2), and subsequent to the output of the first signal, tap, via the detection circuit (1) a further voltage from the resistor (5), generate a second measurement variable, determine whether the second measurement variable undershoots a second limiting value, and in the event of an undershoot of the second limiting value, output a second signal via the evaluation circuit.

12. The method for fault detection as claimed in claim 8, the method including a series-connected arrangement of capacitors (6a, 6b) including the y-capacitor (6a) between the high-voltage potentials (7a, 7b) of the high-voltage system (20) and parallel to the series-connected arrangement of resistors (5), and wherein at least one of the capacitors (6a, 6b) is connected between the high-voltage potentials (7a, 7b) of the high-voltage system (20) and the reference potential (8).

13. The circuit assembly (10) as claimed in claim 1, wherein the detection circuit (1) comprises a series-connected arrangement of a coupling capacitor (13), a diode (14), a limiting resistor (15) and a charging capacitor (16).

14. The circuit assembly (10) as claimed in claim 13, wherein the series-connected arrangement of the detection circuit (1) is electrically connected to a first and second contact of the another resistor (5).

15. The circuit assembly (10) as claimed in claim 14, wherein a discharge resistor (17) is electrically connected in parallel with the charging capacitor (16).

16. The circuit assembly (10) as claimed in claim 13, wherein a discharge resistor (17) is electrically connected in parallel with the charging capacitor (16).

* * * * *